United States Patent
Akimoto et al.

(10) Patent No.: US 8,021,916 B2
(45) Date of Patent: Sep. 20, 2011

(54) METHOD FOR MANUFACTURING SEMICONDUCTOR DEVICE

(75) Inventors: Kengo Akimoto, Atsugi (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 40 days.

(21) Appl. No.: 12/549,603

(22) Filed: Aug. 28, 2009

(65) Prior Publication Data

US 2010/0055832 A1    Mar. 4, 2010

(30) Foreign Application Priority Data

Sep. 1, 2008    (JP) ................... 2008-224061

(51) Int. Cl.
*H01L 21/00*    (2006.01)
(52) U.S. Cl. ................ 438/104; 257/E21.461
(58) Field of Classification Search .............. 438/104; 257/E21.461
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,847,410 A | 12/1998 | Nakajima | |
| 6,261,957 B1 | 7/2001 | Jang et al. | |
| 6,294,274 B1 | 9/2001 | Kawazoe et al. | |
| 6,300,152 B1 * | 10/2001 | Kim | 438/30 |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |

(Continued)

FOREIGN PATENT DOCUMENTS

EP    1737044 A    12/2006

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Charles D Garber
*Assistant Examiner* — Yasser A Abdelaziez
(74) *Attorney, Agent, or Firm* — Eric J. Robinson; Robinson Intellectual Property Law Office, P.C.

(57) ABSTRACT

To provide a method for manufacturing a thin film transistor in which contact resistance between an oxide semiconductor layer and source and drain electrode layers is small, the surfaces of the source and drain electrode layers are subjected to sputtering treatment with plasma and an oxide semiconductor layer containing In, Ga, and Zn is formed successively over the source and drain electrode layers without exposure of the source and drain electrode layers to air.

17 Claims, 7 Drawing Sheets

U.S. PATENT DOCUMENTS

| | | |
|---|---|---|
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2007-250983 A | 9/2007 |
| WO | WO-2004/114391 | 12/2004 |
| WO | WO-2007/119386 | 10/2007 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262103-3.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA Amoled Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure,", IEDM 09: Technical Digest of International Electron Devices Meeting, Dec. 7, 2009, pp. 191-194.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: a hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al, "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size Amoled Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers, ", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15TH International Display Workshops, Dec. 3, 2008, pp. 1637-1640.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem Oleds,", SID Digest '09 : SID International Symposium Digest of Technical Papers, May 31, 2009, pp. 899-902.

Kanno.H et al., "White Stacked Electrophosphorecent Organic Light-Emitting Device Employing MoO.as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9TH International Display Workshops, Dec. 4, 2002, pp. 295-298.

Jeong.J et al., "3.1: Distinguished Paper: 12.1-inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA Amoled Dispay,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Chrystal Transition:The "Blue Phase",", Physics Letters, Sep. 10,1973, vol. 45A, No. 2, pp. 115-116.

Cho.D et al., "21.2:AL and SN-DOPED Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties,", SID Digest '09 : SID International Symposium Digest of Technical Papers, May 31, 2009, pp. 983-985.

Sakata.J et al., "Development of 4.0-IN. Amoled Display With Driver Circuit Using Amorphous IN-GA-ZN-Oxide TFTS,", IDW '09 : Proceedings of the 19TH International Display Workshops, 2009, pp. 689-692.

Park.J et al., "Amorphous Indium-Gallium-Zinc Oxide TFTS and Their Application for Large Size Amoled,", AM-FPD '08 Digest of Technical Papers, Jul. 2, 2008, pp. 275-277.

Park.S et al., "Challenge to Future Displays: Transparent AM-OLED Driven by PEALD Grown ZnO TFT,", IMID '07 Digest, 2007, p. 1249-1252.

Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.

Osada.T et al., "Developement of Driver-Integrated Panel Using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper: Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

Ohara.H et al., "21.3:4.0 IN. QVGA Amoled Display Using IN-GA-ZN-Oxide TFTS With a Novel Passivation Layer,", SID Digest '09 : SID International Symposium Digest of Technical Papers, May 31, 2009, pp. 284-287.

Miyasaka.M, "58.2 Invited Paper : SUFTLA Flexible Microelectronics on Their Way to Business,", SID Digest '07 :SID International Symposium Digest of Technical Paper, 2007, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13TH International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,$YbFe_2O_4$, and $Yb_2Fe_3O_7$ Types of Structures for Compounds in the $In_2O_3$ and $Sc_2O_3$-$A_2O_3$-BO Systems [A:Fe, Ga, or Al; B: Mg, Mn, Fe, Ni, Cu, or Zn] at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.J et al., "Amorphous Indium-Gallium-Zinc Oxide TFTS and Their Application for Large Size Amoled,", AM-FPD '08 Digest of Technical Papers, Jul. 2, 2008, pp. 275-278.

Nowatari.H et al., "60.2: Intermediate Connector With Suppressed Voltage Loss for White Tandem Oleds", SID Digest '09: SID International Symposium Digest of Technical Papers, May 31, 2009, vol. 40, pp. 899-902.

* cited by examiner

# METHOD FOR MANUFACTURING SEMICONDUCTOR DEVICE

BACKGROUND OF THE INVENTION

1. Field of the Invention

The present invention relates to a method for manufacturing a semiconductor device which has a circuit including a thin film transistor (hereinafter, referred to as a TFT) in which a channel formation region is formed using an oxide semiconductor film. For example, the present invention relates to a method for manufacturing a semiconductor device which is mounted on an electro-optical device typified by a liquid crystal display panel or a light-emitting display device including an organic light-emitting element.

Note that the semiconductor device in this specification indicates all the devices which can operate by using semiconductor characteristics, and an electro-optical device, a semiconductor circuit, and an electronic appliance are all included in the semiconductor devices.

2. Description of the Related Art

In recent years, active-matrix display devices (such as liquid crystal display devices, light-emitting display devices, or electrophoretic display devices) in which a switching element of a thin film transistor (TFT) is provided for each of display pixels arranged in matrix have been actively developed. In the active-matrix display devices, a switching element is provided for each of pixels (or each of dots), and thus, there is such an advantage that the active matrix display devices can be driven at lower voltage than passive matrix display devices in the case where the pixel density is increased.

In addition, a technique has attracted attention, where a thin film transistor (TFT) or the like in which a channel formation region is formed using an oxide semiconductor film is applied to electronic devices or optical devices. For example, a TFT in which ZnO is used for an oxide semiconductor film or a TFT in which $InGaO_3(ZnO)_m$ is used for an oxide semiconductor film can be given. A technique in which a TFT including such an oxide semiconductor film is formed over a light-transmitting substrate and used as a switching element or the like of an image display device is disclosed in Patent Document 1 and Patent Document 2.

REFERENCES

Patent Document

[Patent Document 1] Japanese Published Patent Application No. 2007-123861
[Patent Document 2] Japanese Published Patent Application No. 2007-96055

SUMMARY OF THE INVENTION

In forming a thin film transistor, source and drain electrode layers are formed using a low resistance metal material. In particular, in the case of manufacturing display devices performing large-area display, the problem of signal delay due to wiring resistance becomes significant. Therefore, a metal material having low electric resistance is preferably used as a material of a wiring or an electrode.

Further, when contact resistance between the source and drain electrode layers and the oxide semiconductor film is high, ON current is suppressed. One of the causes which make the contact resistance high is that an interface at which the source and drain electrode layers and the oxide semiconductor film are in contact with each other has high electrical resistance due to a film of oxide or contaminant generated on the surfaces of the source and drain electrode layers.

An object of the present invention is to provide a method for manufacturing a thin film transistor in which contact resistance between an oxide semiconductor layer containing indium (In), gallium (Ga), and zinc (Zn) and source and drain electrode layers is small.

The gist of the present invention includes a method for manufacturing a semiconductor device in which after sputtering treatment with plasma is performed on surfaces of source and drain electrode layers, an oxide semiconductor layer containing In, Ga, and Zn is successively formed over the source and drain electrode layers without exposure of the surfaces of the source and drain electrode layers to air.

In this specification, a semiconductor layer formed using an oxide semiconductor film containing In, Ga, and Zn is also referred to as an "IGZO semiconductor layer".

The source and drain electrode layers are formed through a patterning step by a photolithography method, an ink-jet method, or the like. However, a film of oxide or contaminant is formed on the surfaces of the source and drain electrode layers in the patterning step unintentionally in some cases. When the oxide semiconductor layer containing In, Ga, and Zn is formed over the film of oxide or contaminant, contact resistance between the oxide semiconductor layer and the source and drain electrode layers is increased.

In the present invention, a film of oxide or contaminant on the surfaces of the source and drain electrode layers is removed by sputtering treatment with plasma, and further, an oxide semiconductor layer containing In, Ga, and Zn is formed successively with the surfaces of the source and drain electrode layers kept clean and not exposed to air.

One embodiment of the present invention is a method for manufacturing a semiconductor device including steps of performing sputtering treatment with plasma on surfaces of source and drain electrode layers and forming an oxide semiconductor layer containing In, Ga, and Zn successively over the source and drain electrode layers without exposure of the source and drain electrode layers to air.

Another embodiment of the present invention is a method for manufacturing a semiconductor device including steps of forming a gate electrode layer over a substrate; forming a gate insulating film which covers the gate electrode layer; forming source and drain electrode layers end portions of which overlap with the gate electrode layer with the gate insulating film interposed therebetween; performing sputtering treatment with plasma on surfaces of the source and drain electrode layers; and forming an oxide semiconductor layer containing indium, gallium, and zinc over the source and drain electrode layers without exposure of the source and drain electrode layers to air.

Another embodiment of the present invention is a method for manufacturing a semiconductor device including steps of forming source and drain electrode layers over a substrate; performing sputtering treatment with plasma on surfaces of the source and drain electrode layers; forming an oxide semiconductor layer containing indium, gallium, and zinc successively over the source and drain electrode layers without exposure of the surfaces of the source and drain electrode layers to air; forming a gate insulating film which covers the oxide semiconductor layer; and forming a gate electrode layer over a channel formation region of the oxide semiconductor layer with the gate insulating film interposed therebetween.

Another embodiment of the present invention is the method for manufacturing a semiconductor device in which the plasma treatment is performed on the surfaces of the source and drain electrode layers in an inert gas atmosphere.

By applying one embodiment of the present invention, the surfaces of the source and drain electrode layers are cleaned and the oxide semiconductor layer containing In, Ga, and Zn can be formed over the source and drain electrode layers with the surfaces of the source and drain electrode layers kept clean; therefore, contact resistance between the source and drain electrode layers and the oxide semiconductor layer containing In, Ga, and Zn can be reduced. As a result, a thin film transistor having a high on/off ratio can be manufactured. Further, a method for manufacturing a semiconductor device having favorable electrical properties and reliability with high productivity can be provided.

DETAILED DESCRIPTION OF THE INVENTION

Hereinafter, embodiments and an example of the present invention will be described with reference to the accompanying drawings. Note that it is easily understood by those skilled in the art that the present invention is not limited to the description below and that a variety of changes can be made in forms and details without departing from the spirit and the scope of the present invention. Therefore, the present invention is not to be construed with limitation to what is described in the embodiments and the example. Note that in a structure of the present invention described below, like portions or portions having like functions in different drawings are denoted by the like reference numerals and repeated description thereof is omitted.

Embodiment 1

In this embodiment, a thin film transistor and a manufacturing process thereof will be described with reference to FIGS. 1A and 1B and FIGS. 2A to 2E.

Figure 1A:
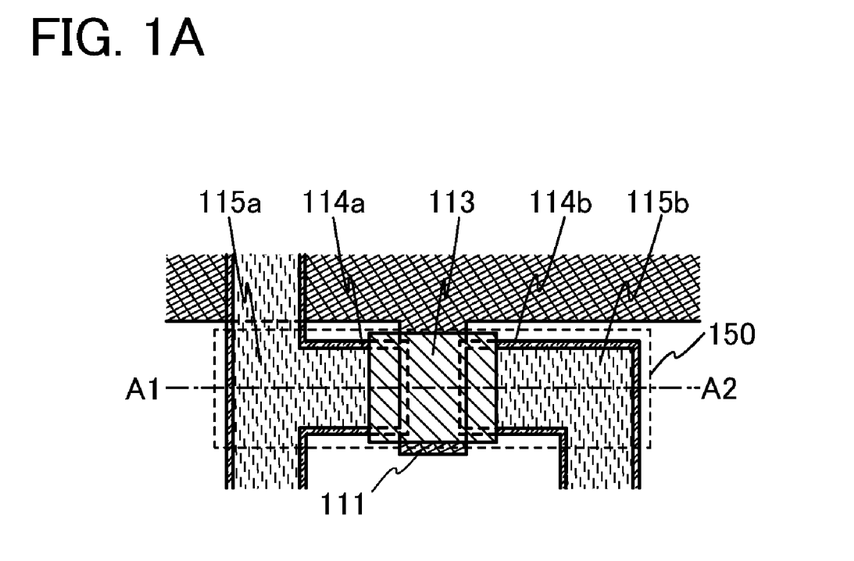
FIGS. 1A and 1B are views illustrating a structure of a thin film transistor which is manufactured in the present invention.
Figure 1B:
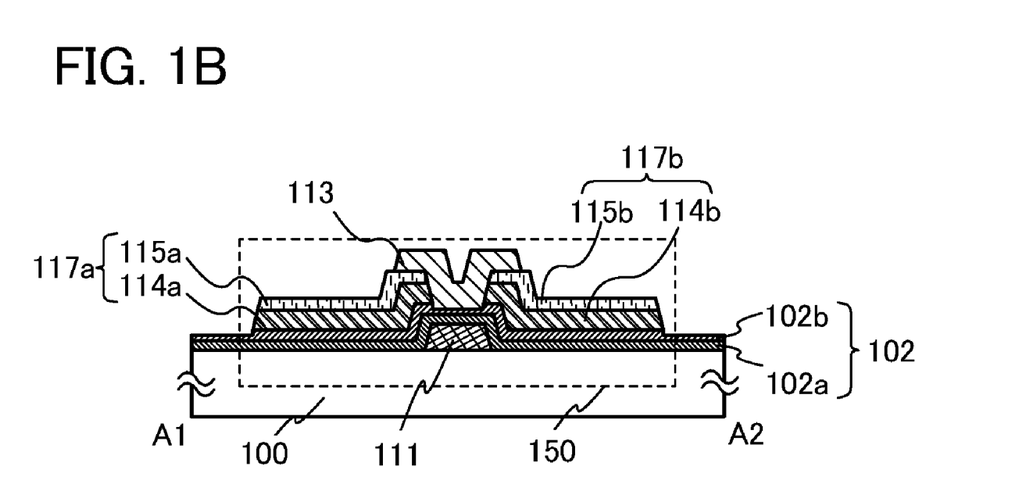

FIGS. 1A and 1B illustrate a bottom gate thin film transistor of this embodiment. FIG. 1A is a plan view and FIG. 1B is a cross-sectional view taken along line A1-A2 in FIG. 1A. In a thin film transistor 150 illustrated in FIGS. 1A and 1B, a gate electrode layer 111 is formed over a substrate 100, a gate insulating film 102 is formed over the gate electrode layer 111, source and drain electrode layers 117a and 117b are formed over the gate electrode layer 111 with the gate insulating film 102 interposed therebetween, and a semiconductor layer 113 which serves as a channel formation region is formed between the source and drain electrode layers 117a and 117b. Note that in this embodiment, the gate insulating film 102 includes two layers, a first gate insulating film 102a and a second gate insulating film 102b.

In FIG. 1B, the source and drain electrode layers (117a and 117b) include a layer containing aluminum as its main component (114a and 114b) and a high-melting-point metal material layer (115a and 115b), respectively. Sputtering treatment with plasma is performed on surfaces of the source and drain electrode layers (117a and 117b) and a region of a surface of the second gate insulating film (102b) which is not covered with the source and drain electrode layers (117a and 117b), so that a film of oxide or contaminant is removed.

In the present invention, an oxide semiconductor containing In, Ga, and Zn is used as the semiconductor layer 113. An oxide semiconductor layer containing In, Ga, and Zn absorb little light and is not photoexcited easily; therefore, it is not necessary to shield the channel formation region from light by covering the channel formation region with the gate electrode layer.

A method for manufacturing the thin film transistor 150 illustrated in FIGS. 1A and 1B will be described with reference to FIGS. 2A to 2E.

As the substrate 100, any of the following substrates can be used: non-alkaline glass substrates manufactured by a fusion method or a float method, such as a barium borosilicate glass substrate, an aluminoborosilicate glass substrate, an aluminosilicate glass substrate, and the like; ceramic substrates; plastic substrates having heat resistance high enough to withstand a process temperature of this manufacturing process; and the like. Alternatively, a metal substrate of a stainless alloy or the like, which is provided with an insulating film over its surface, may be used. In the case where the substrate 100 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Further, an insulating film may be provided as a base film over the substrate 100. The base film can be formed to have a single-layer structure or a stacked structure of a silicon oxide film, a silicon nitride film, a silicon oxynitride film, and/or a silicon nitride oxide film by a CVD method, a sputtering method, or the like.

The gate electrode layer 111 is formed using a metal material. As the metal material, aluminum, chromium, titanium, tantalum, molybdenum, copper, or the like is applied. The gate electrode layer may be a single conductive film and as a preferable example, the gate electrode layer is formed using a layer containing aluminum as its main component or has a stacked layer structure in which a layer containing aluminum as its main component and a barrier metal layer are stacked.

For a layer containing aluminum as its main component, an aluminum alloy to which an element which improves heat resistance or an element which prevents hillock, such as tungsten, titanium, tantalum, molybdenum, nickel, platinum, copper, gold, silver, manganese, carbon, or silicon, or an alloy material or a compound which contains any of these elements as its main component is added is used.

As a barrier metal layer, a high-melting-point metal, such as titanium, molybdenum, or chromium, is used. The barrier metal layer is preferably provided so as to prevent hillock or oxidation of aluminum.

A conductive film which is to be the gate electrode layer 111 is formed to a thickness greater than or equal to 50 nm and less than or equal to 300 nm. By forming the gate electrode layer 111 to a thickness less than or equal to 300 nm, disconnection of a semiconductor film and wirings which are to be formed later can be prevented. Further, by forming the gate electrode layer 111 to a thickness greater than or equal to 150 nm and less than or equal to 300 nm, resistance of the gate electrode layer can be reduced and thus the size of the substrate can be increased.

Note that since a semiconductor film is to be formed over the gate electrode layer 111, it is desired that the gate electrode layer 111 be processed to have tapered end portions in order to prevent disconnection. In addition, although not illustrated, in this step, a wiring or a capacitor wiring connected to the gate electrode layer can also be formed at the same time.

The gate electrode layer 111 can be formed by a sputtering method, a CVD method, a plating method, a printing method, or the like. Alternatively, the gate electrode layer 111 can be formed by discharging a conductive nanopaste of silver, gold, copper, or the like by an ink-jet method and baking it.

Note that here, an aluminum film and a molybdenum film are deposited so as to be stacked by a sputtering method as a conductive film over the substrate. Next, with the use of a resist mask formed using a first photomask in this embodiment, the conductive film is etched to form the gate electrode layer 111.

The gate insulating films 102a and 102b can each be formed using a silicon oxide film, a silicon nitride film, a silicon oxynitride film, or a silicon nitride oxide film with a thickness of from 50 nm to 150 nm. Note that instead of a two-layer structure, the gate insulating film can be formed as a single layer of a silicon oxide film, a silicon nitride film, a silicon oxynitride film, or a silicon nitride oxide film. Alternatively, the gate insulating film may be formed to have a three-layer structure.

The gate insulating film 102a is formed using a silicon nitride film or a silicon nitride oxide film, whereby adhesion between the substrate and the first gate insulating film 102a is increased. In the case where a glass substrate is used as the substrate, an impurity can be prevented from diffusing into the semiconductor layer 113 from the substrate and further, the gate electrode layer 111 can be prevented from being oxidized. That is to say, film peeling can be prevented, and thus electrical properties of a thin film transistor which is completed later can be improved. Further, the first gate insulating film 102a and the second gate insulating film 102b each preferably have a thickness greater than or equal to 50 nm so that they can cover unevenness of the gate electrode layer 111.

Here, a silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

Further, for the gate insulating film 102b in contact with the semiconductor layer 113, silicon oxide, aluminum oxide, magnesium oxide, aluminum nitride, yttrium oxide, or hafnium oxide can be used for example.

Figure 2A:
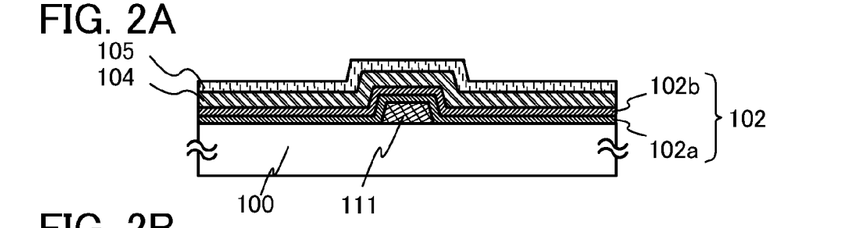
FIGS. 2A to 2E are views illustrating a method for manufacturing a thin film transistor of the present invention.

The first gate insulating film 102a and the second gate insulating film 102b can each be formed by a CVD method, a sputtering method, or the like. Here, as illustrated in FIG. 2A, a silicon nitride film is formed by a plasma CVD method as the first gate insulating film 102a and a silicon oxide film is formed by a plasma CVD method as the second gate insulating film 102b.

In this embodiment, conductive films which are to be the source and drain electrode layers include a first conductive film 104 and a second conductive film 105. The first conductive film 104 and the second conductive film 105 can be formed by a sputtering method or a vacuum evaporation method.

The conductive films which are to be source and drain electrode layers can be formed using the same material as the gate electrode layer 111. Here, as illustrated in FIG. 2A, the conductive film 104 containing aluminum as its main component and the conductive film 105 formed using a high-melting-point metal material are stacked.

For the conductive film 105 formed using a high-melting-point metal material, titanium, tantalum, tungsten, molybdenum, or the like can be used. In particular, it is preferable that a titanium film be a layer in contact with the oxide semiconductor layer containing In, Ga, and Zn. As a specific example of the conductive film, a single titanium film, a stacked film of a titanium film and an aluminum film, or a three-layer structure in which a titanium film, an aluminum film, and a titanium film are stacked in this order may be used.

Further, as the conductive film 105, a transparent conductive film may be used, and as a material thereof, indium tin oxide, indium tin oxide containing silicon or silicon oxide, indium zinc oxide, zinc oxide, or the like can be used.

Figure 2B:
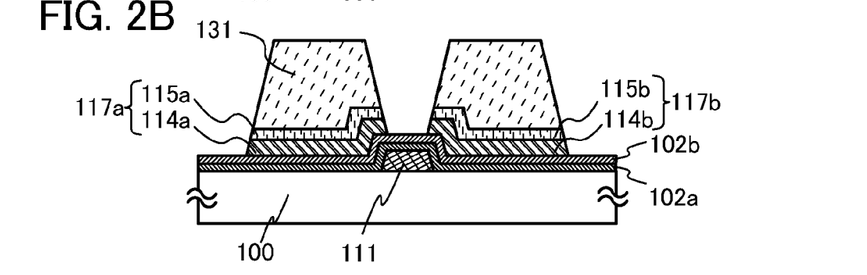

Next, a resist mask 131 is formed over the conductive films 104 and 105 by a photolithography method or an ink-jet method. With the use of the resist mask 131, the conductive films 104 and 105 over the gate insulating film 102b are selectively etched to form the source and drain electrode layers (117a and 117b) as illustrated in FIG. 2B.

Note that since a semiconductor film is to be formed over the source and drain electrode layers (117a and 117b), it is desired that the source and drain electrode layers be processed so as to have tapered end portions in order to prevent disconnection.

Not only an atmospheric component but also a variety of substances are in contact with surfaces of the source and drain electrode layers (117a and 117b) in a patterning step. For example, in the case of using a photolithography technique, a resist or a remover of the resist are in contact with the surfaces of the source and drain electrode layers. Alternatively, in the case of using an ink-jet method, an additive such as a solvent or a dispersant contained in the ink are in contact with the surfaces of the source and drain electrode layers. As a result, a film of oxide or contaminant is formed on the surfaces of the source and drain electrode layers (117a and 117b). The film of oxide or contaminant causes increase in contact resistance with the oxide semiconductor layer containing In, Ga, and Zn.

Next, in order to remove the film of oxide or contaminant which is formed on the surfaces of the source and drain electrode layers (117a and 117b), sputtering treatment with plasma is performed on the surfaces of the source and drain electrode layers (117a and 117b), so that the surfaces of the conductive films are cleaned. As a gas used in the sputtering, an inert gas with respect to the source and drain electrode layers is used. For example, a rare gas such as Ar can be given as an example thereof. Note that oxygen or the like may be mixed with the gas as long as a film of oxide or the like which increases contact resistance is not formed on the surfaces of the source and drain electrode layers.

As a method of sputtering treatment with plasma, a reverse sputtering method can be employed, for example. A reverse sputtering method is a method in which without application of voltage to a target side in a sputtering apparatus, voltage is applied to a substrate side under an inert gas (e.g. an argon gas) atmosphere and plasma is generated on the substrate side to etch the surface of the substrate.

The conditions of a reverse sputtering method are as follows: RF sputtering is performed with a pressure in a chamber of preferably 0.2 Pa to 4.0 Pa using an Ar gas with a power of preferably 50 W to 2 kW.

As a result of the sputtering treatment with plasma, the surfaces of the source and drain electrode layers (117a and 117b) are cleaned.

Figure 2C:
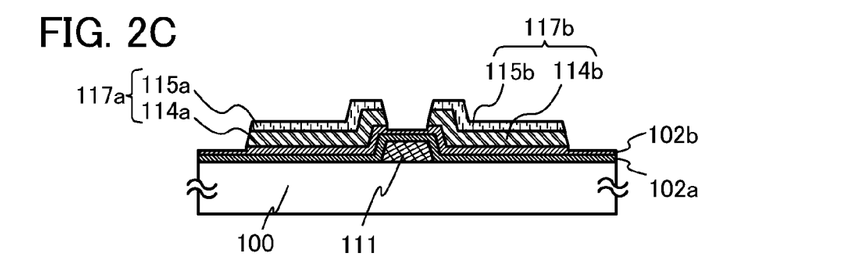

Note that as illustrated in FIG. 2C, a region of the surface of the gate insulating film (102b) which is not covered with the source and drain electrode layers (117a and 117b) and the surfaces of the source and drain electrode layers (117a and 117b) are subjected to sputtering treatment with plasma, and therefore, are slightly reduced in thickness in some cases.

Figure 2D:
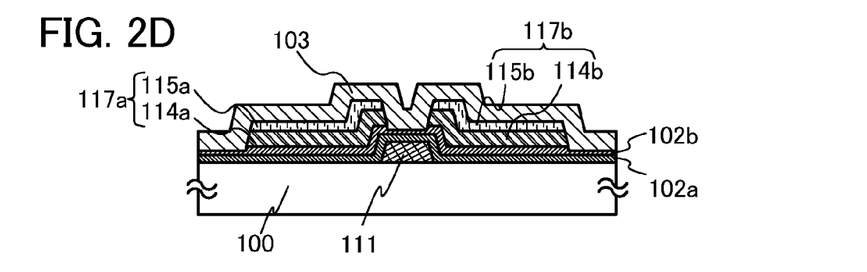

Next, without exposure of the surfaces of the source and drain electrode layers (117a and 117b) on which sputtering treatment with plasma has been performed to air, deposition of the semiconductor film 103 over the source and drain electrode layers (117a and 117b) is performed as illustrated in FIG. 2D, following the plasma treatment. The semiconductor film 103 is deposited successively without exposure of the surfaces on which the sputtering treatment with plasma has been performed to air, whereby an atmospheric component or contaminant in air can be prevented from attaching to the surfaces, so that the surfaces can be kept clean.

As a method for depositing the semiconductor film 103 successively without exposure of the surfaces of the source and drain electrode layers (117a and 117b) on which the sputtering treatment with plasma has been performed to air, a method of using a multichamber manufacturing apparatus in which a plasma treatment chamber and a deposition chamber of the semiconductor film 103 are connected to each other can be given as an example.

Further, in the case of depositing an oxide semiconductor film 103 containing In, Ga, and Zn by a sputtering method, the method in which a reverse sputtering method is performed on the surfaces of the source and drain electrode layers in a deposition chamber of the semiconductor film 103 before formation of the semiconductor film 103 is preferable since the apparatus and the step of the method are simple.

As the semiconductor film 103, an oxide containing In, Ga, and Zn can be used. In the case of using an oxide containing In, Ga, and Zn as the semiconductor film 103, the oxide containing In, Ga, and Zn is formed to a thickness greater than or equal to 2 nm and less than or equal to 200 nm, preferably greater than or equal to 20 nm and less than or equal to 150 nm. Further, when the oxygen vacancy rate in the film is increased, a carrier concentration is increased and thus thin film transistor characteristics are degraded. Therefore, the oxide containing In, Ga, and Zn is deposited in an atmosphere containing oxygen.

An oxide semiconductor containing In, Ga, and Zn can be deposited by a reactive sputtering method or a pulsed laser deposition method (PLD method). Among vapor deposition methods, a PLD method is suitable in terms of ease of controlling a composition of materials, and a sputtering method is suitable in terms of mass productivity.

Here, a target with a diameter of 8 inch obtained by mixing indium oxide ($In_2O_3$), gallium oxide ($Ga_2O_3$), and zinc oxide (ZnO) in an equimolar ratio and performing sintering is used, and a substrate is provided 170 mm apart from the target, and direct current (DC) sputtering is performed with a power of 500 W, so that the semiconductor film is formed. The semiconductor film is formed to a thickness of 50 nm under the conditions that the chamber pressure is 0.4 Pa and the gas composition ratio of Ar to $O_2$ is 10 to 5 sccm. It is desirable that an oxygen partial pressure in film formation be set higher than that in forming a transparent conductive film of indium tin oxide (ITO) or the like to control the oxygen concentration in a film formation atmosphere so that oxygen vacancy is suppressed. Further, it is preferable to use a pulsed direct current (DC) power supply because dusts can be reduced and the thickness distribution of the semiconductor film can be uniform.

Figure 2E:
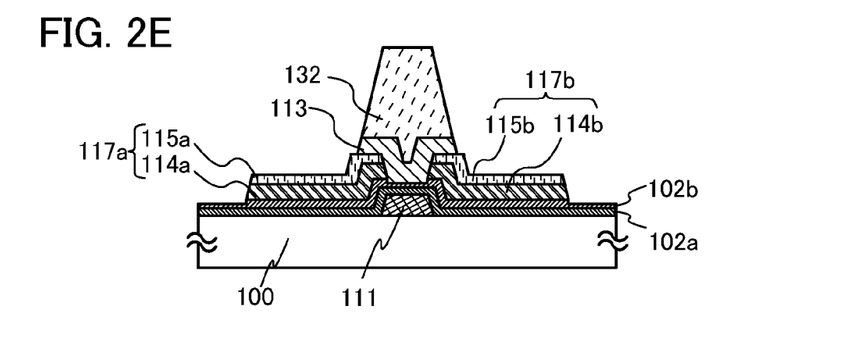

Next, a resist mask 132 is formed over the semiconductor film 103 by a photolithography technique or an ink-jet method. With the use of the resist mask 132, the semiconductor film 103 is selectively etched by dry etching or wet etching to form the semiconductor layer 113 as illustrated in FIG. 2E.

As an example of a method for etching the oxide semiconductor film containing In, Ga, and Zn, an organic acid such as a citric acid or an oxalic acid can be used as an etchant. For example, the semiconductor film 103 with a thickness of 50 nm can be processed by etching with ITO07N (manufactured by Kanto Chemical Co., Inc.) in 150 seconds.

In a thin film transistor using the oxide semiconductor containing In, Ga, and Zn, the oxide semiconductor layer 113 is subjected to heat treatment, whereby the characteristics thereof are improved.

Since high energy is provided to a target with an Ar ion in a sputtering method, in the case of depositing an IGZO film by a sputtering method, it is considered that high strain energy exists in the IGZO film which is deposited and the strain energy inhibits carrier transfer. In order to release this strain energy, heat treatment is performed at 200° C. to 600° C., typically 300° C. to 500° C. It is considered that rearrangement at an atomic level is performed by this heat treatment, and thus the strain energy which inhibits carrier transfer is released. From such a reason, heat treatment after the deposition (including light annealing) is important.

Figure 3:
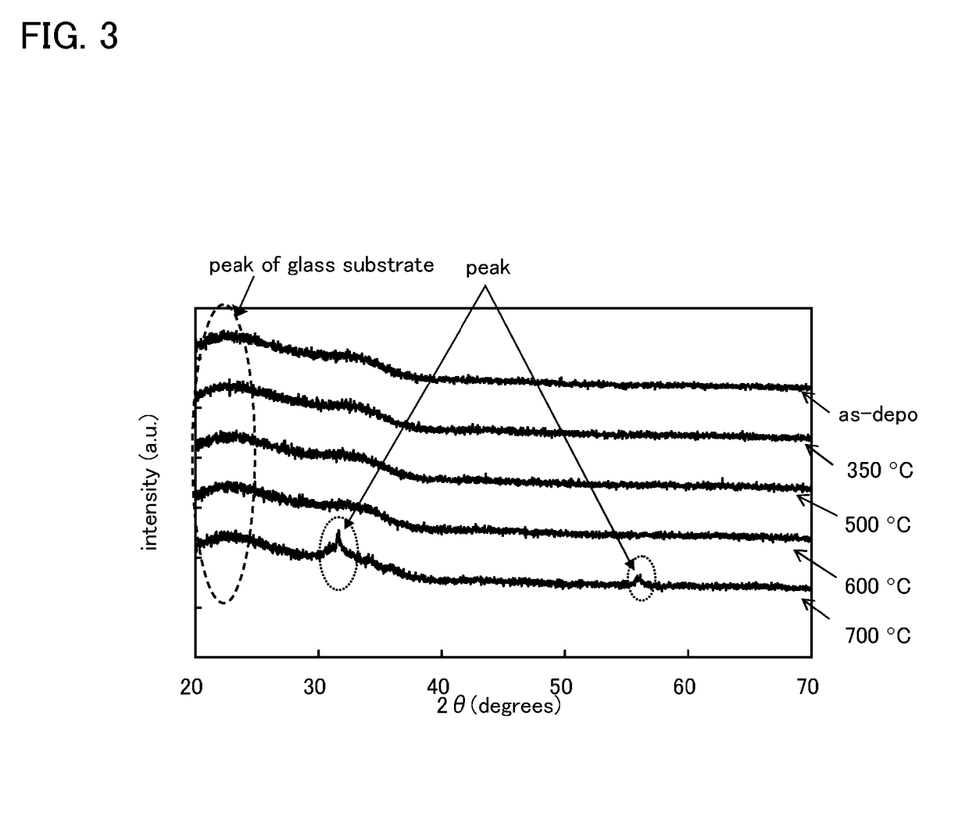
FIG. 3 is an X-ray diffraction pattern of an oxide semiconductor layer containing In, Ga, and Zn which is used in the present invention.

Change of the oxide semiconductor film containing In, Ga, and Zn with heat treatment was investigated by an X-ray diffraction (XRD) method. As a sample, an IGZO film with a thickness of 400 nm was deposited over a glass substrate by a DC sputtering method. FIG. 3 is an XRD chart.

First, the XRD chart of the IGZO film right after the deposition is denoted by "as-depo" in FIG. 3. XRD charts of the samples on which heat treatment was performed at different temperatures for one hour in a nitrogen atmosphere after the deposition are illustrated in FIG. 3 together with the process temperatures. That is, FIG. 3 shows charts of the samples on which heat treatment was performed at 350° C., 500° C., 600° C., and 700° C. Note that in order to compare the charts of the different samples, the charts are arranged for convenience.

In the sample on which the heat treatment was performed at 700° C., peaks indicating crystallization were observed clearly in the ranges of $30° \leq 2\theta \leq 35°$ and $55° \leq 2\theta \leq 60°$. Further, when the heat treatment is performed at higher than or equal to 700° C., clear crystallization is observed.

However, when the heat treatment is performed at 200° C. to 600° C., crystal growth due to great transfer of atoms does not occur unlike when the heat treatment is performed at higher than or equal to 700° C.

In this embodiment, the heat treatment is performed on the oxide semiconductor film 103 containing In, Ga, and Zn at 350° C. for one hour. The heat treatment may be performed in any step after deposition of the semiconductor film 103. For example, the heat treatment may be performed after deposition of the semiconductor film 103 or after formation of the semiconductor layer 113. Alternatively, the heat treatment may be performed after formation of a sealing film of a thin film transistor or may be performed by another heat treatment such as thermal cure treatment which is performed after formation of a planarization film.

Further, plasma treatment may be performed on the semiconductor layer 113. By the plasma treatment, damage due to the etching which is performed in forming the semiconductor layer 113 can be repaired. The plasma treatment is preferably performed in an atmosphere containing $O_2$, $N_2O$, preferably oxygen. Note that as a specific example of an atmosphere containing oxygen, a gas in which oxygen is added to $N_2$, He, Ar, or the like can be given. Alternatively, the plasma treatment may be performed in an atmosphere in which $Cl_2$ and $CF_4$ are added to the above atmosphere. Note that the plasma treatment is preferably performed with non-bias applied.

By the method described above, the bottom gate thin film transistor illustrated in FIGS. 1A and 1B is manufactured.

According to this embodiment, with the surfaces of the source and drain electrode layers kept clean, the oxide semiconductor layer containing In, Ga, and Zn can be formed; therefore, a thin film transistor in which contact resistance between the source and drain electrode layers and the oxide semiconductor layer containing In, Ga, and Zn is reduced can be provided.

Accordingly, by applying the present invention, a thin film transistor having a high on/off ratio can be manufactured. Further, a semiconductor device which includes a thin film transistor having favorable electrical characteristics and reliability can be provided by a method which is excellent in productivity.

Embodiment 2

Figure 4:
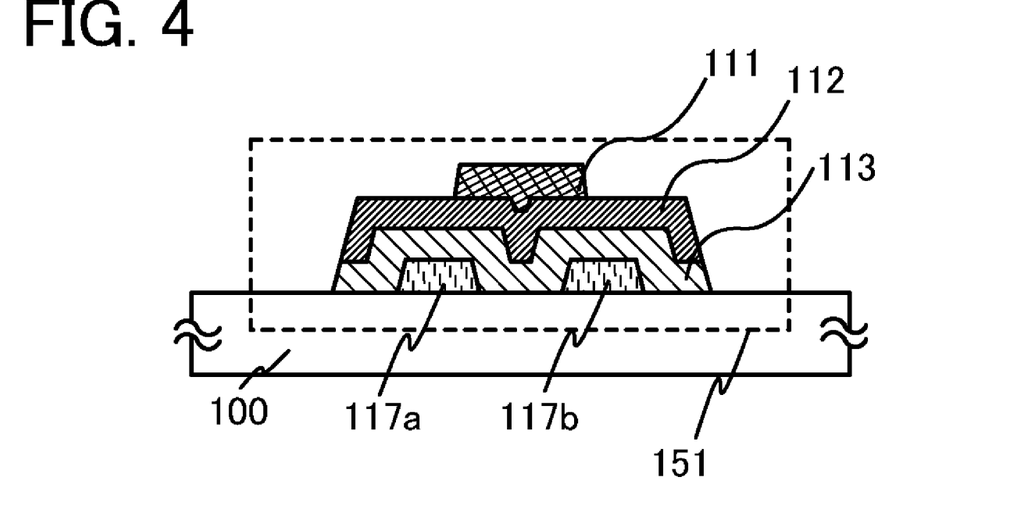
FIG. 4 is a view illustrating a structure of a thin film transistor which is manufactured in the present invention.

In this embodiment, a thin film transistor mode of which is different from that in Embodiment 1 and a manufacturing process of the thin film transistor will be described with reference to FIG. 4 and FIGS. 5A to 5E. FIG. 4 is a cross-sectional view illustrating a staggered thin film transistor of this embodiment. In a thin film transistor 151 illustrated in FIG. 4, the source and drain electrode layers (117a and 117b) are formed over the substrate 100 and the semiconductor layer 113 is formed so as to cover the source and drain electrode layers (117a and 117b). A gate insulating layer 112 is formed over the semiconductor layer 113 and the gate electrode layer 111 is formed so as to overlap with the channel formation region with the gate insulating layer 112 interposed therebetween.

In FIG. 4, the source and drain electrode layers (117a and 117b) are formed using a high-melting-point metal material layer. Sputtering treatment with plasma is performed on the surfaces of the source and drain electrode layers (117a and 117b), and thus a film of oxide or contaminant is removed.

In the present invention, an oxide semiconductor containing In, Ga, and Zn is used as the semiconductor layer 113. An oxide semiconductor layer containing In, Ga, and Zn absorb little light and is not photoexcited easily; therefore, it is not necessary to shield the channel formation region from light by covering the channel formation region with the gate electrode layer. In other words, in the channel formation region, an overlap with the gate electrode layer and the source and drain electrode layers can be reduced, so that parasitic capacitance can be reduced.

A method for manufacturing the thin film transistor 151 illustrated in FIG. 4 will be described with reference to FIGS. 5A to 5E.

As the substrate 100, a substrate similar to that in Embodiment 1 can be used. In this embodiment, a non-alkali glass substrate is used.

As a conductive film which is to be the source and drain electrode layers, the same material as that of the gate electrode layer 111 which is described in Embodiment 1 can be used. The conductive film which is to be the source and drain electrode layers can be deposited by a sputtering method or a vacuum evaporation method.

The conductive film which is to be the source and drain electrode layers may be a single layer or a plurality of layers. In particular, a layer in contact with the oxide semiconductor layer containing In, Ga, and Zn is preferably a titanium film.

Figure 5A:
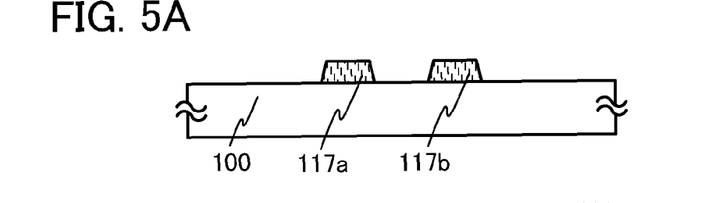
FIGS. 5A to 5E are views illustrating a method for manufacturing a thin film transistor of the present invention.

In this embodiment, the pair of source and drain electrode layers (117a and 117b) is formed using a high-melting-point metal material as illustrated in FIG. 5A. Such minute processing can be performed using a resist mask formed by a photolithography technique or an ink-jet method.

Note that since a semiconductor film is to be formed over the source and drain electrode layers (117a and 117b), it is desired that the source and drain electrode layers be processed so as to have tapered end portions in order to prevent disconnection.

Not only an atmospheric component but also a variety of substances are in contact with surfaces of the source and drain electrode layers (117a and 117b) in the patterning step, and thus a film of oxide or contaminant is formed on the surfaces of the source and drain electrode layers (117a and 117b).

Here, the film of oxide or contaminant on the surfaces of the source and drain electrode layers (117a and 117b) is removed by a reverse sputtering method. As in Embodiment 1, a reverse sputtering method can be performed with the use of a sputtering apparatus in which the oxide semiconductor layer containing In, Ga, and Zn is formed.

As a gas used in the sputtering, an inert gas with respect to the source and drain electrode layers is used. Here, RF sputtering is performed under the following conditions: Ar is used as a gas used in the sputtering, the pressure in a chamber is preferably 0.2 Pa to 4.0 Pa, and a power is preferably 50 W to 2 kW.

Note that when sputtering treatment with plasma is performed on the substrate surface or in the case where the base film is formed on the substrate surface, a portion of a base film which is not covered with the source and drain electrode layers (117a and 117b), slight reduction in thickness is caused in some cases.

Figure 5B:
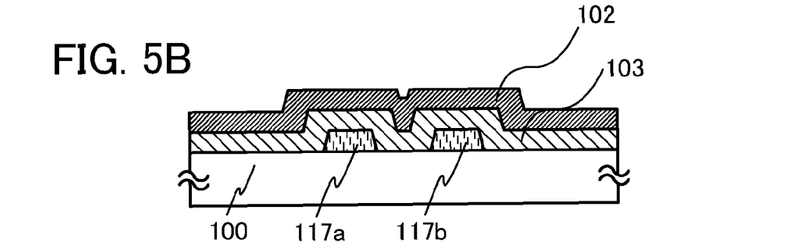

Next, without exposure of the surfaces of the source and drain electrode layers (117a and 117b) on which sputtering treatment with plasma has been performed to air, deposition of the oxide semiconductor film 103 over the source and drain electrode layers (117a and 117b) is performed following the plasma treatment. Note that the deposition conditions of the oxide semiconductor film containing In, Ga, and Zn are similar to those in Embodiment 1. FIG. 5B illustrates a cross-sectional view in this step.

Subsequently, without exposure of the oxide semiconductor film 103 containing In, Ga, and Zn to air, the gate insulating film 102 is deposited over the oxide semiconductor film 103 successively. When the gate insulating film 102 is deposited successively without exposure of the surface of the oxide semiconductor film 103 to air, productivity can be improved, and further, it is possible to form an interface between stacked layers where there is no contamination due to an atmospheric component such as moisture or an impurity element or a dust floating in air; therefore, variations in the characteristics of thin film transistors can be reduced.

In this specification, in successive deposition, a substrate to be processed is placed in an atmosphere which is controlled to be vacuum or an inert gas atmosphere (a nitrogen atmosphere or a rare gas atmosphere) at all times without being exposed to a contaminant atmosphere such as air during a process from a first film formation step using a sputtering method to a second film formation step using a sputtering method. By the successive formation, a film can be formed while preventing moisture or the like from being attached again to the substrate to be processed which is cleaned.

For example, performing the process from the first film formation step to the second film formation step in the same chamber is within the scope of the successive formation in this specification.

In addition, the following is also within the scope of the successive formation in this specification: in the case of performing the process from the first film formation step to the second film formation step in plural chambers, the substrate is transferred after the first film formation step to another chamber without being exposed to air and subjected to the second film formation.

Note that between the first film formation step and the second film formation step, a substrate transfer step, an alignment step, a slow-cooling step, a step of heating or cooling the substrate to a temperature which is necessary for the second film formation step, or the like may be provided. Such a process is also within the scope of the successive formation in this specification.

A step in which liquid is used, such as a cleaning step, wet etching, or resist formation, may be provided between the first film formation step and the second film formation step. This case is not within the scope of the successive formation in this specification.

Note that here, following the deposition of the oxide semiconductor film 103, as illustrated in FIG. 5B, the gate insulating film 102 formed using a silicon oxide film is formed with the use of a multi-chamber sputtering apparatus provided with a silicon target and a target for the oxide semiconductor film.

Figure 5C:
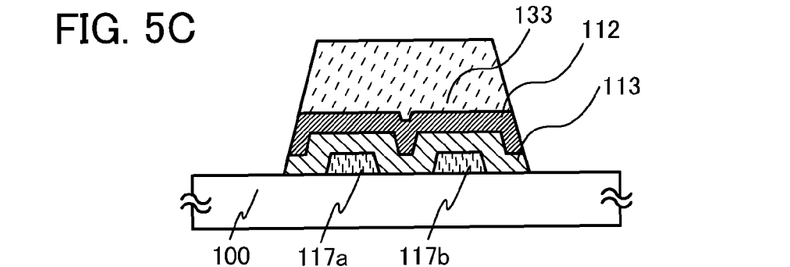

Next, with the use of a resist mask 133 formed by a photolithography technique or an ink-jet method, the gate insulating film 102 and the oxide semiconductor film 103 containing In, Ga, and Zn are etched to form the oxide semiconductor layer 113 and the gate insulating layer 112 as illustrated in FIG. 5C.

Figure 5D:
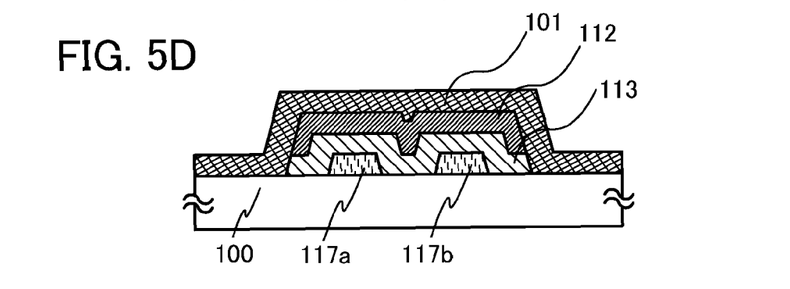

Next, a conductive film 101 which is to be a gate electrode layer is formed as illustrated in FIG. 5D. The gate electrode layer can be formed in a manner similar to that of Embodiment 1. In this embodiment, a single layer of a high-melting-point metal conductive film is used.

Figure 5E:
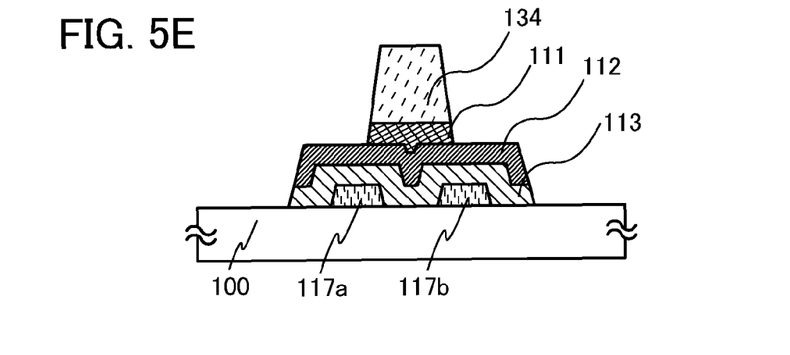

Next, with the use of a resist mask 134 formed by a photolithography technique or an ink-jet method, the conductive film 101 is etched to form the gate electrode layer 111 as illustrated in FIG. 5E.

By the method described above, the staggered thin film transistor illustrated in FIG. 4 is manufactured.

In the thin film transistor manufactured in this embodiment, with the surfaces of the source and drain electrode layers kept clean, the oxide semiconductor layer containing In, Ga, and Zn can be formed; therefore, contact resistance between the source and drain electrode layers and the oxide semiconductor layer containing In, Ga, and Zn can be reduced.

Accordingly, by applying the present invention, a thin film transistor having a high on/off ratio can be manufactured. Further, a semiconductor device which includes a thin film transistor having favorable electrical characteristics and reliability can be provided by a method which is excellent in productivity.

Example 1

In this example, a case where a bottom gate thin film transistor is manufactured by the method for manufacturing a semiconductor device which is described in Embodiment 1 will be described. Further, electrical properties of the thin film transistor are compared to those of a thin film transistor which is manufactured without performing plasma treatment on surfaces of source and drain electrode layers.

In this example, plasma treatment was performed on the surfaces of the source and drain electrode layers by a reverse sputtering method. The conditions of a reverse sputtering method were as follows: RF sputtering was performed with a pressure in a chamber of 0.4 Pa, a flow rate of an Ar gas of 50 sccm, and a power of 200 W.

The thin film transistor manufactured has a gate insulating film formed using a silicon oxynitride film with a thickness of 100 nm over a gate electrode layer formed using a tungsten film with a thickness of 100 nm; source and drain electrode layers formed using a tungsten film with a thickness of 100 nm end portions of which overlap with the gate electrode layer with the gate insulating film interposed therebetween; and an oxide semiconductor layer formed using an IGZO film with a thickness of 50 nm over a channel formation region. The channel length and the channel width are 100 μm.

Figure 6:
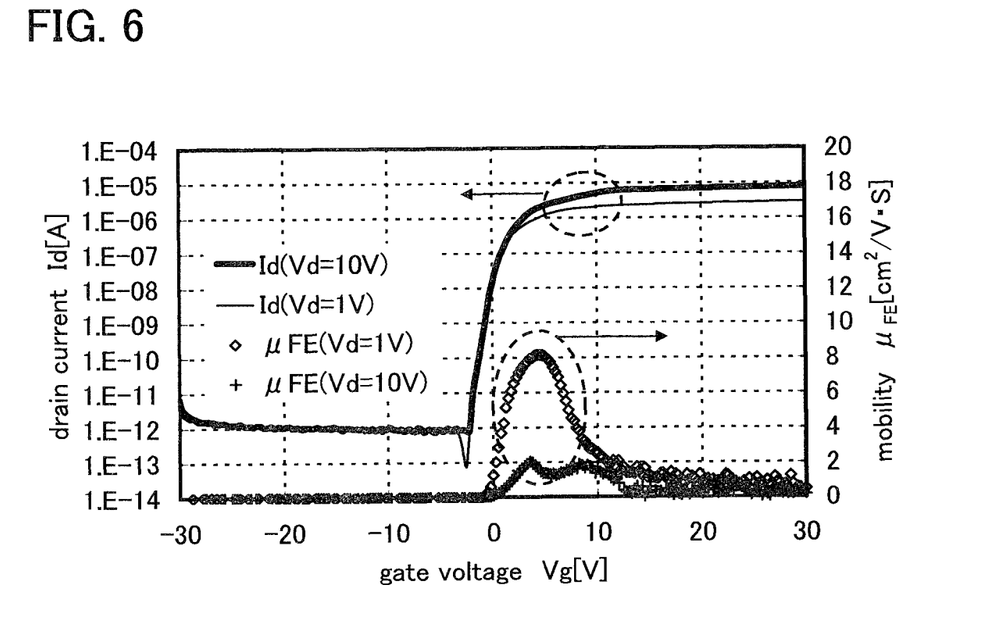
FIG. 6 is a chart showing electrical properties of a thin film transistor to which the present invention is applied.

FIG. 6 shows the electrical properties (gate voltage-drain current characteristics, an $I_d$-$V_g$ curve) of the thin film transistor in which after performing plasma treatment on the surfaces of the source and drain electrode layers by a reverse sputtering method, the oxide semiconductor layer containing In, Ga, and Zn is formed without exposure of the surfaces of the source and drain electrode layers to air.

Figure 7:
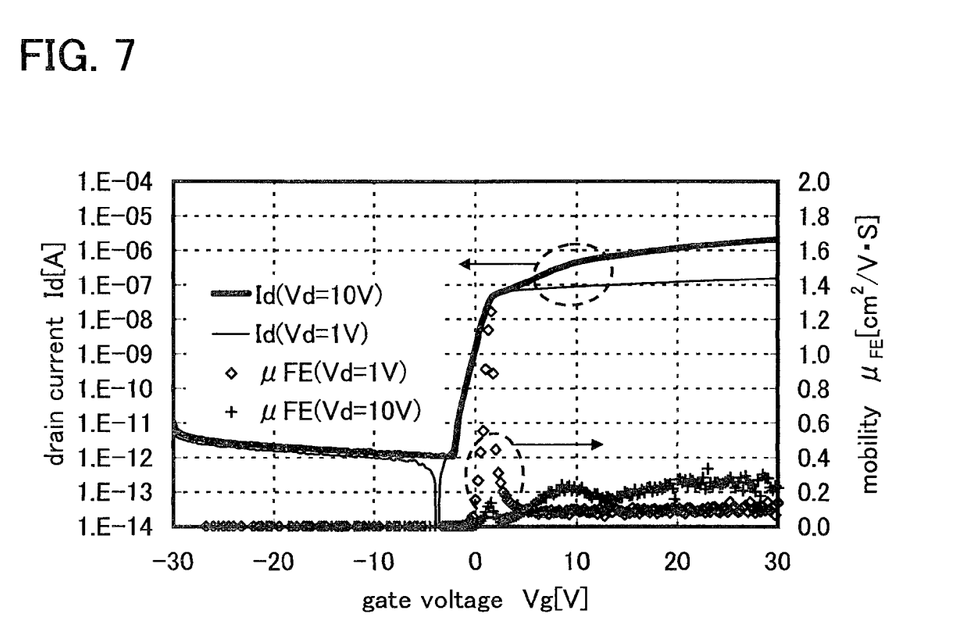
FIG. 7 is a chart showing electrical properties of a thin film transistor which is manufactured as a comparative example.

As a comparative example, FIG. 7 shows an $I_d$-$V_g$ curve of a thin film transistor in which the oxide semiconductor layer containing In, Ga, and Zn was formed without performing plasma treatment on the surfaces of the source and drain electrode layers. Note that the measurements were performed at a drain voltage (a voltage of a drain with respect to a voltage of a source) of 1 V and 10 V.

Comparing the $I_d$-$V_g$ curve in FIG. 6 with that in FIG. 7, it is found that the thin film transistor of FIG. 6 in which plasma treatment was performed on the surfaces of the source and drain electrode layers by a reverse sputtering method has higher ON current regardless of conditions of the drain voltages. Further, there is no large difference in off current.

By applying one embodiment of the present invention as described above, a thin film transistor which can obtain high ON current while suppressing off current, that is, a thin film transistor having a high on/off ratio can be manufactured. Further, one embodiment of the present invention provides a method for manufacturing a semiconductor device having favorable electrical properties and reliability with high productivity.

This application is based on Japanese Patent Application serial no. 2008-224061 filed with Japan Patent Office on Sep. 1, 2008, the entire contents of which are hereby incorporated by reference.

What is claimed is:

1. A method for manufacturing a semiconductor device comprising the steps of:
   forming source and drain electrode layers over a substrate;
   performing a sputtering treatment on surfaces of the source and drain electrode layers;

after performing the sputtering treatment, forming an oxide semiconductor layer over the source and drain electrode layers successively without exposure of the source and drain electrode layers to air;

forming an insulating film over the oxide semiconductor layer; and forming a gate electrode layer over a channel formation region of the oxide semiconductor layer with the insulating film interposed therebetween.

2. The method for manufacturing a semiconductor device according to claim 1, wherein the oxide semiconductor layer comprises indium, gallium and zinc.

3. The method for manufacturing a semiconductor device according to claim 1, wherein the sputtering treatment is performed in an inert gas atmosphere.

4. The method for manufacturing a semiconductor device according to claim 3, wherein the inert gas atmosphere comprises rare gas.

5. A method for manufacturing a semiconductor device comprising the steps of:

forming source and drain electrode layers over a substrate;

applying a voltage to gas containing an inert gas for producing plasma of the gas;

exposing surfaces of the source and drain electrode layers to the plasma so that the surfaces of the source and drain electrode layers are etched by the plasma; and after exposing the surfaces of the source and drain electrode layers to the plasma, forming an oxide semiconductor layer over the source and drain electrode layers successively without exposure of the source and drain electrode layers to air.

6. The method for manufacturing a semiconductor device according to claim 5, wherein the oxide semiconductor layer comprises indium, gallium and zinc.

7. The method for manufacturing a semiconductor device according to claim 5, wherein the inert gas is rare gas.

8. A method for manufacturing a semiconductor device comprising the steps of:

forming a gate electrode layer over a substrate;

forming an insulating film over the gate electrode layer;

forming source and drain electrode layers, end portions of which overlap with the gate electrode layer with the insulating film interposed therebetween;

applying a voltage to gas containing an inert gas for producing plasma of the gas;

exposing surfaces of the source and drain electrode layers to the plasma so that the surfaces of the source and drain electrode layers are etched by the plasma; and after exposing the surfaces of the source and drain electrode layers to the plasma, forming an oxide semiconductor layer over the source and drain electrode layers successively without exposure of the source and drain electrode layers to air.

9. The method for manufacturing a semiconductor device according to claim 8, wherein the oxide semiconductor layer comprises indium, gallium and zinc.

10. The method for manufacturing a semiconductor device according to claim 8, wherein the inert gas is rare gas.

11. A method for manufacturing a semiconductor device comprising the steps of:

forming source and drain electrode layers over a substrate;

applying a voltage to gas containing an inert gas for producing plasma of the gas;

exposing surfaces of the source and drain electrode layers to the plasma so that the surfaces of the source and drain electrode layers are etched by the plasma;

after exposing the surfaces of the source and drain electrode layers to the plasma, forming an oxide semiconductor layer over the source and drain electrode layers successively without exposure of the source and drain electrode layers to air;

forming an insulating film over the oxide semiconductor layer; and forming a gate electrode layer over a channel formation region of the oxide semiconductor layer with the insulating film interposed therebetween.

12. The method for manufacturing a semiconductor device according to claim 11, wherein the oxide semiconductor layer comprises indium, gallium and zinc.

13. The method for manufacturing a semiconductor device according to claim 11, wherein the inert gas is rare gas.

14. A method for manufacturing a semiconductor device comprising the steps of:

forming source and drain electrode layers over a substrate;

etching surfaces of the source and drain electrode layers; and after etching the surfaces of the source and drain electrode layers, forming an oxide semiconductor layer over the source and drain electrode layers successively without exposure of the source and drain electrode layers to air.

15. The method for manufacturing a semiconductor device according to claim 14, wherein the oxide semiconductor layer comprises indium, gallium and zinc.

16. A method for manufacturing a semiconductor device comprising the steps of:

forming a gate electrode layer over a substrate;

forming an insulating film over the gate electrode layer;

forming source and drain electrode layers, end portions of which overlap with the gate electrode layer with the insulating film interposed therebetween;

etching surfaces of the source and drain electrode layers; and after etching the surfaces of the source and drain electrode layers, forming an oxide semiconductor layer over the source and drain electrode layers successively without exposure of the source and drain electrode layers to air.

17. The method for manufacturing a semiconductor device according to claim 16, wherein the oxide semiconductor layer comprises indium, gallium and zinc.

* * * * *